(12) United States Patent
Chu

(10) Patent No.: US 6,337,240 B1
(45) Date of Patent: Jan. 8, 2002

(54) METHOD FOR FABRICATING AN EMBEDDED DYNAMIC RANDOM ACCESS MEMORY

(75) Inventor: Chih-Hsun Chu, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/237,496

(22) Filed: Jan. 25, 1999

(30) Foreign Application Priority Data

Oct. 21, 1998 (TW) .......................................... 87117426

(51) Int. Cl.⁷ .......................................... H01L 21/8242
(52) U.S. Cl. ........................................ 438/241; 438/981
(58) Field of Search ................................ 438/241, 253, 438/396, 528, 655, 656, 981

(56) References Cited

U.S. PATENT DOCUMENTS 5,668,035 A * 9/1997 Fang et al. ................. 438/241
5,858,831 A * 1/1999 Sung .......................... 438/241
5,863,820 A * 1/1999 Huang ........................ 438/241

* cited by examiner

Primary Examiner—Chandra Chaudhari
(74) Attorney, Agent, or Firm—Jiawei Huang; J.C. Patents

(57) ABSTRACT

A method for fabricating an embedded dynamic random access memory (DRAM) is provided. The method contains implanting ions onto the substrate at a DRAM active area and a logic circuit with different dopant concentration. A thermal oxidation process is performed to form a DRAM gate oxide layer with a greater thickness than that of a logic gate oxide layer. A DRAM MOS transistor is formed at a DRAM region and a logic MOS transistor is formed at a logic region. The DRAM MOS transistor has a polycide gate structure. The logic transistor has a first self-aligned silicide (Salicide) layer on its gate structure, and a second Salicide on its interchangeable source/drain region. A dielectric layer is formed over the substrate. A contact opening is formed in the dielectric layer by patterning the dielectric layer to expose the interchangeable source/drain region of the DRAM transistor. A stack capacitor is formed on the dielectric layer.

20 Claims, 6 Drawing Sheets

METHOD FOR FABRICATING AN EMBEDDED DYNAMIC RANDOM ACCESS MEMORY

CROSS-REFERENCE TO RELATED APPLICATION

This applications claims the priority benefit of Taiwan application serial no. 87117426, filed Oct. 21, 1998, the full disclosure of which is incorporated herein by reference.

BACKGROUND OF THE INVENTION

1. Field of the Invention

This invention relates to semiconductor fabrication, and more particularly to a method for fabricating an embedded dynamic random access memory device.

2. Description of Related Art

An embedded dynamic random access memory (DRAM) device is a kind of device that includes a memory array and a logic circuit array formed together in a single integrated circuit (IC) chip. This embedded DRAM therefore can access a large amount of data with much higher accessing speed so that the embedded DRAM with its advantages is widely used in a logic circuit, which is used for a purpose to process a large amount of data, such as a graphic or an image microprocessor. An accomplished embedded DRAM, typically includes a logic circuit, a transfer field effect transistor (transfer FET) array, and a capacitor coupled to the transfer FET, in which the transfer FET serves as a lower electrode of the capacitor and a selective switch when the transfer FET is selected by a bit line. The voltage status of the capacitor can therefore be read or changed through the transfer FET. One FET typically includes a gate structure and an interchangeable source/drain region at each side of the gate structure. The capacitor is coupled to the interchangeable source/drain region at one side of the gate structure, which typically is the source region.

FIGS. 1A–1E are cross-sectional views of a portion of a semiconductor substrate, schematically illustrating a conventional fabrication process for forming an embedded DRAM. In FIG. 1A, an isolation structure 102 is formed on a semiconductor substrate 100 so as to form a DRAM active area 170 and a logic active area 180 on the substrate 100. A DRAM transfer FET is to be formed on the DRAM active region 170, and a logic transfer FET included in a logic circuit is to be formed on the logic active region 180. In order to obtain a smaller gate resistance, a formation of a gate includes depositing a polysilicon layer on the substrate 100, forming a silicide layer on the polysilicon layer to form a polycide layer, and patterning the polycide layer. An alternative method is first depositing a patterned polysilicon layer on the substrate 100, performing a self-aligned silicide (Salicide) process to form a Salicide layer on all exposed silicon surface of the patterned polysilicon and an interchangeable source/drain region. However, the Salicide process usually consumes the junction depth to cause a shallow junction, which may further cause a charge leakage of the capacitor. The DRAM device may results in a failure at the end. A strategy combining above two methods is then proposed. In the embedded DRAM, a gate structure is usually formed by a polysilicon layer and a silicide layer through deposition. The interchangeable source/drain region of a transistor belonging to the DRAM is not formed with a Salicide layer so as to avoid the charge leakage. But, the interchangeable source/drain region of a transistor belonging to the logic circuit is formed with a Salicide layer to reduce its sheet resistance so that the logic circuit has faster operation speed. In order to form the Salicide layer only on the logic transistor, a conventional method is described in the following.

In FIG. 1A, a usually thin oxide layer 104 is formed over the substrate 100. A polysilicon layer 106 and a silicide layer 108 are sequentially formed on the oxide layer 104. This two layers 106, 108 are usually called together as a polycide layer. A cap layer 110 is formed on the silicide layer 108.

In FIG. 1B, patterning the cap layer 110, the silicide layer 108, the polysilicon layer 106, and the oxide layer 104 forms a gate structure 112 on the DRAM active area 170 of FIG. 1A, and a gate structure 114 on the logic active area 180 of FIG. 1A. The gate structure 112 includes a cap layer 110a, a silicide layer 108a, a polysilicon layer 106a, and the oxide layer 104a; and the gate structure 114 includes a cap layer 110b, a silicide layer 108b, a polysilicon layer 106b, and the oxide layer 104b. Using the cap layers 110a, 110b as a mask, an interchangeable source/drain region 128 and an interchangeable source/drain region 130 are respectively forms in the substrate 100 at each side of the gate structure 128 and the gate structure 130.

In FIG. 1C, an annealing process at a temperature of 900° C.–1000° C. is performed to uniformly diffuse the implanted ions so that the interchangeable source/drain regions 128, 130 become the interchangeable source/drain regions 128a, 130a. So, each of the DRAM active area 170 an the logic active area 180 of FIG. 1A respectively have a formed DRAM FET and a formed logic FET. The DRAM FET includes the gate structure 112 and the interchangeable source/drain regions 128a, and the logic FET includes the gate structure 114 and the interchangeable source/drain region 130a. A spacer 120 is formed on each sidewall of the gate structure 112 and a spacer 122 is formed on each sidewall of the gate structure 114. In order to decrease the sheet resistance of the interchangeable source/drain region 130a of the logic FET at the logic active area 180 of FIG. 1A, a Salicide layer is desired to be formed on the interchangeable source/drain region 130a, but not on the interchangeable source/drain region 128a of the DRAM FET. A typical process is forming an insulating layer 132 over the DRAM FET. A Salicide process is performed by first forming a metal layer 134 over the substrate 100.

In FIG. 1D, a rapid thermal process (RTP) is performed to trigger a reaction between silicon of the interchangeable source/drain region 130a and the metal layer 134 so as to form a Salicide layer 136 on it. Using a mix acid solution of $H_2O_2$ and $NH_4OH$ as an etchant, a wet etching process is performed to remove the metal layer 134 without reaction.

In FIG. 1E, a dielectric layer 140 is formed over the substrate 100. The dielectric layer 140 is patterned to form a contact opening 142 to expose the interchangeable source/drain region 128a of the DRAM FET at one side of the gate structure 128a. A capacitor 150 including a polysilicon layer 144 serving as a lower electrode, a dielectric film layer 146, and a polysilicon upper electrode 148 is formed on the dielectric layer 140. The capacitor 150 is coupled to the DRAM FET through the contact opening 142. The DRAM FET with the capacitor 150 is accomplished.

In the conventional fabrication method describe above, the thickness of the gate oxide layer 104a of the gate structure 112, shown in FIG. 1B, for the DRAM FET is equal to the thickness of the gate oxide layer 104b of the gate structure 114 for the logic FET. In an actual operating condition, the DRAM FET is applied with a higher bias than a bias applied on the logic FET. This causes the gate oxide layer 104a of the DRAM FET needs to endure a higher bias than the gate oxide layer 104b of the logic FET. If the gate oxide layers 104a, 104b are formed with a greater thickness suitable for the DRAM FET, the logic FET may not be activated. If the gate oxide layers 104a, 104b are formed with a smaller thickness suitable for the logic FET, the DRAM FET may get a breakdown.

On the other hand, in order to reduce the gate resistance of the gate structure 112 of the DRAM FET and avoid a charge leakage due to shallow junction occurring on the interchangeable source/drain region 128a, both gate structures 112 and 114 respectively having the polysilicon layer 106a and 106b, and the silicide layers 108a and 108b. In this strategy, even though the gate resistance of the DRAM FET is reduced, the operating performance of the logic FET is reduced.

SUMMARY OF THE INVENTION

It is therefore an objective of the present invention to provide a method for fabricating an embedded DRAM so as to have a suitable different gate oxide thickness for a DRAM FET and a logic FET. When the DRAM FET and the logic FET are applied with a different bias, they can properly work without the phenomena that the DRAM FET gets a breakdown or the logic FET cannot be activated.

It is another an objective of the present invention to provide a method for fabricating an embedded DRAM so as to reduce a gate resistance of a DRAM FET and increase the performance of a logic FET.

It is still another an objective of the present invention to provide a method for fabricating an embedded DRAM so as to reduce a sheet resistance of a junction region of a logic FET so that the logic performance is improved. A junction depth of a DRAM FET is also maintained so as to prevent a charge leakage of a coupled capacitor from occurring.

In accordance with the foregoing and other objectives of the present invention, a method for fabricating an embedded DRAM is provided. The method includes doping a semiconductor substrate, which has a DRAM region and a logic region, at desired active areas with different dopant concentration for a DRAM FET and a logic FET. A thermal oxidation process is performed to form a DRAM oxide layer on the substrate at the DRAM region and a logic oxide layer on the substrate at the logic region. The DRAM oxide layer is thicker than the logic oxide layer. A polysilicon layer is formed over the substrate. A silicide layer and a cap layer are formed on the polysilicon layer at the DRAM region. A DRAM gate is formed by patterning all layers on the substrate at the DRAM region, and a logic semi-gate is formed by simultaneously patterning all layers on the substrate at the logic region. The logic semi-gate is partially done at the current stage.

Using the DRAM gate and the logic semi-gate as a mask, a DRAM lightly doped region and a logic lightly doped region in the substrate respectively at each side of the DRAM gate and the logic semi-gate are formed. A DRAM spacer and a logic spacer are respectively formed on each sidewall of the DRAM gate and the logic semi-gate. Using the DRAM gate, the logic semi-gate, and all the spacers as a mask, a DRAM heavily doped region and a logic heavily doped region in the substrate respectively at each side of the DRAM gate and the logic semi-gate are formed. Each lightly doped region and each heavily doped region form two interchangeable source/drain regions with a lightly doped drain (LDD) structure. The one in the DRAM region is called a DRAM interchangeable source/drain region, and the one in the logic region is called a logic interchangeable source/drain region. An annealing process is performed to obtain a better dopant distribution in the interchangeable source/drain regions at the DRAM region and the logic region. Due to the annealing process, a native oxide layer is simultaneously formed over the substrate. A portion of the native oxide layer on the logic region is removed so as to expose the logic semi-gate and the substrate. A Salicide process is performed to form a Salicide layer on the logic interchangeable source/drain region and the logic semi-gate, which with the Salicide layer becomes a logic gate.

A capacitor is formed on the DRAM interchange source/drain by forming a dielectric layer over the substrate, patterning the dielectric layer to form a contact opening in the dielectric layer to expose the DRAM interchangeable source/drain region at one side of the DRAM gate. A lower electrode is formed to have a coupling with the DRAM interchangeable source/drain region through the contact opening. A conformal dielectric film layer is formed over an exposed upper portion of the lower electrode on the dielectric layer. An upper electrode is formed over the dielectric film layer so that the capacitor is formed with a coupling to the DRAM interchangeable source/drain region.

BRIEF DESCRIPTION OF THE DRAWINGS

The invention can be more fully understood by reading the following detailed description of the preferred embodiment, with reference made to the accompanying drawings as follows.

DETAILED DESCRIPTION OF PREFERRED EMBODIMENT

A completed single DRAM chip usually includes at an embedded DRAM array, a logic circuit, and a switch circuit. Since the operation biases of the DRAM array and the logic circuit are different, the purpose of the switch circuit is to provide the logic circuit with a needed bias when, for example, the external input bias on the logic circuit is different from the needed bias. Each of the DRAM array, the logic circuit, and the switch circuit usually includes several field-effect transistors (FETs). All FETs belong to these three parts are formed together in a single chip. The FETs included in the logic circuit and the switch circuit have similar structure but the FETs in DRAM have different structure. In the invention, one DRAM FET is used to represent a FET in the DREAM array and one logic FET is used to represent a FET in a periphery circuit, including at least the logic circuit and the switch circuit.

Figure 1A:
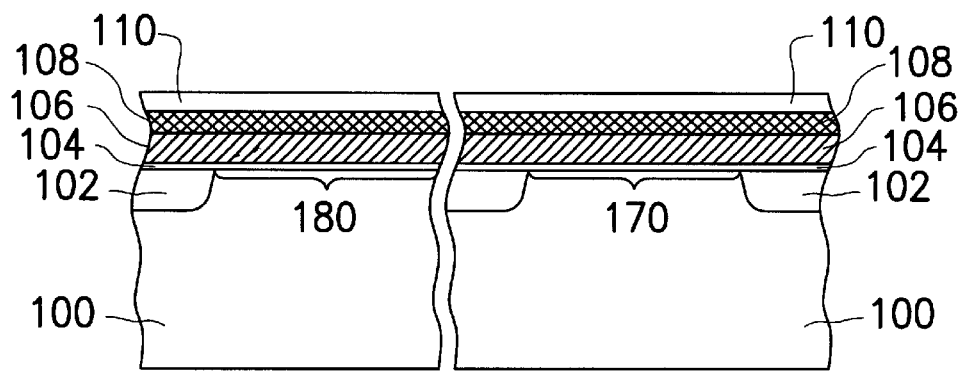
FIGS. 1A–1E are cross-sectional views of a portion of a semiconductor substrate, schematically illustrating a conventional fabrication process for forming an embedded DRAM.
Figure 1B:
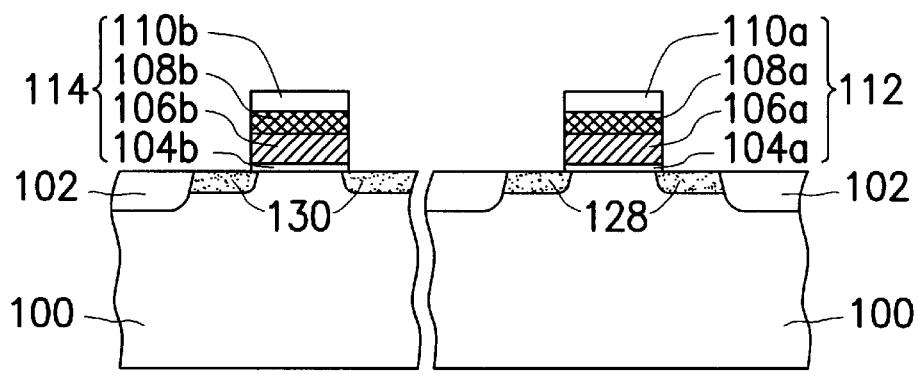
Figure 1C:
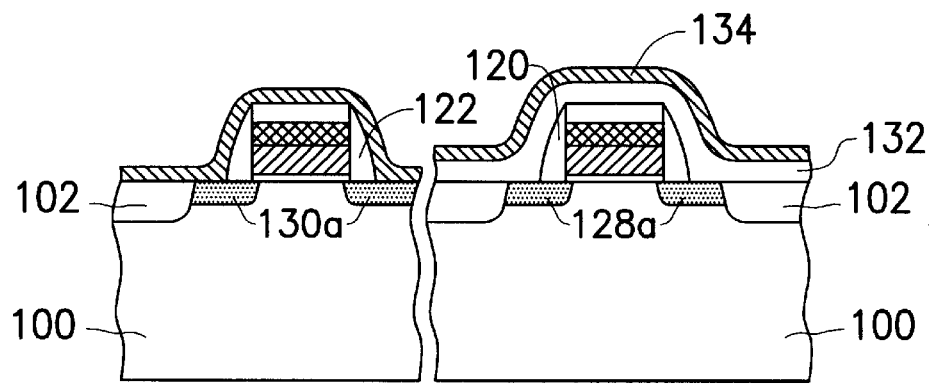
Figure 1D:
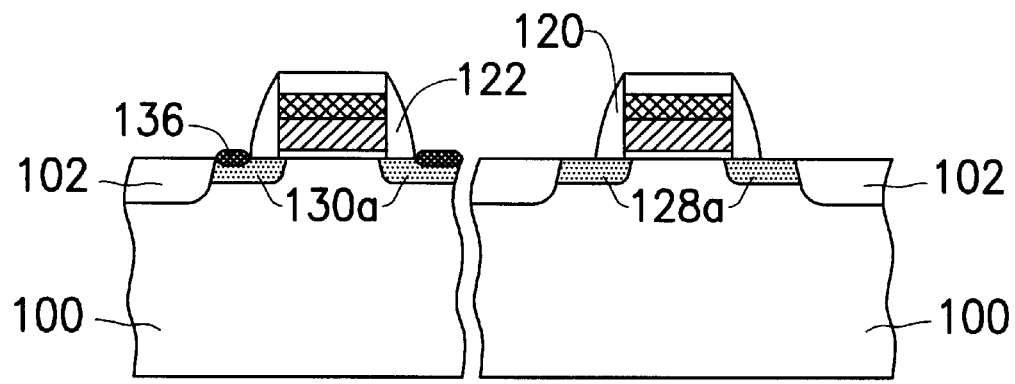
Figure 1E:
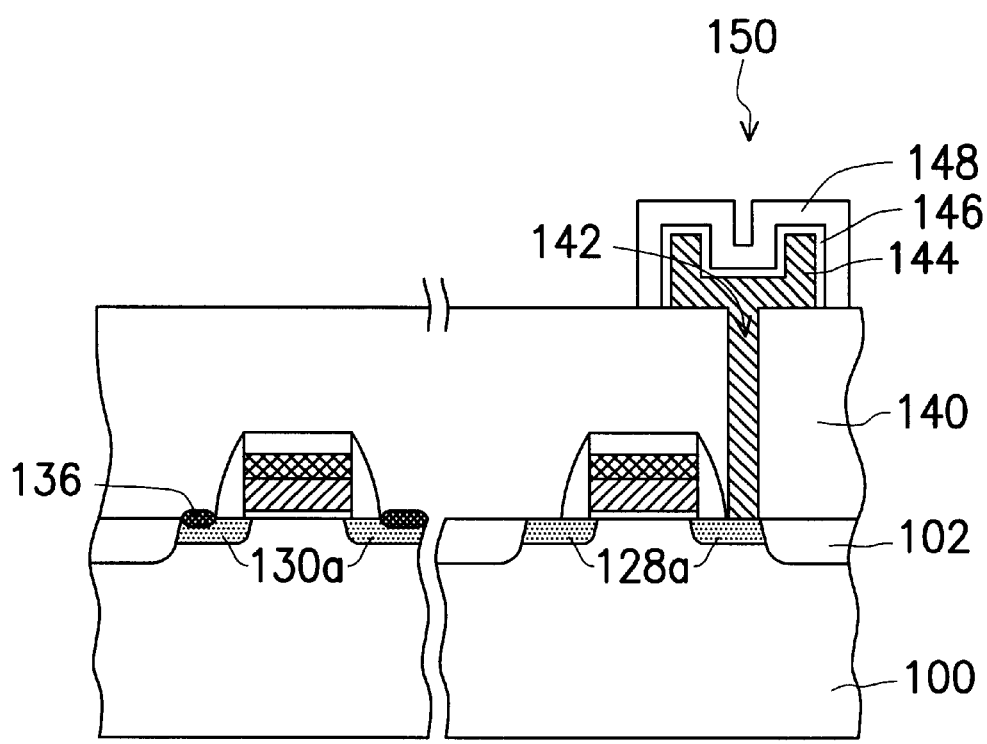
Figure 2A:
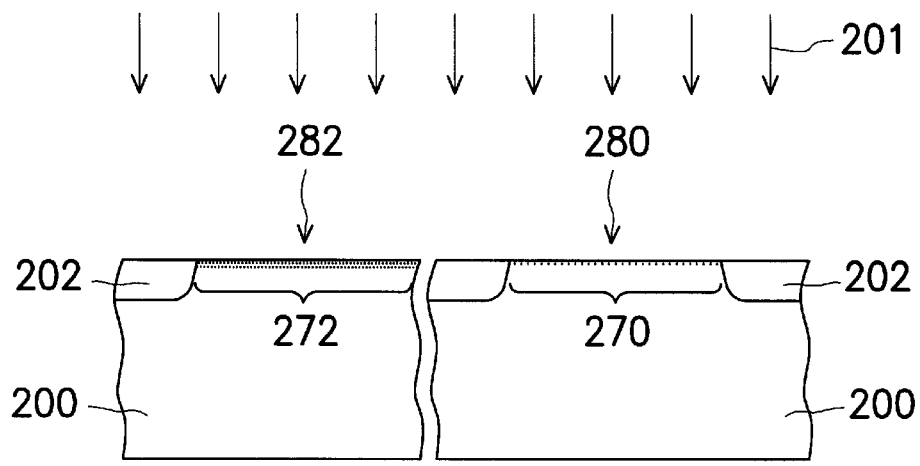
FIGS. 2A–2G are cross-sectional views of a portion of a semiconductor substrate, schematically illustrating a fabrication process for forming an embedded DRAM, according to a preferred embodiment of the invention, in which a capacitor is a stack type.

FIGS. 2A–2G are cross-sectional views of a portion of a semiconductor substrate, schematically illustrating a fabrication process for forming an embedded DRAM, according to a preferred embodiment of the invention. In FIG. 2A, a semiconductor substrate 200, such as a P-type substrate, having a DRAM region 280 and a logic region 282, or called a periphery region, is provided. An isolation structure 202 is formed on the substrate 200 to define several active areas, which are enclosed by the isolation structure 202. The active areas located in the DRAM region 280 are generally called a DRAM active area 270, and the active areas located in the logic region 282 are generally called a logic active area 272. The isolation structure 202 can be, for example, a field oxide layer formed by local oxidation (LOCOS) process or a shallow trench isolation (STI) structure.

In the early stage of fabrication, several processes are performed but not mentioned because they are typical and well known by the one skilled in the art. Those pre-processes are, for example, field implantation for an N-type metal-oxide semiconductor (NMOS) FET and a P-type metal-oxide semiconductor (PMOS) FET, anti-punchthrough implantation, or a pre-formation of a N-well and P-well for a complementary metal-oxide semiconductor (CMOS) FET.

Since the operation mechanisms for the DRAM array, the logic circuit, and the switch circuit are different, the transistors are typically divided into two types. One is a DRAM FET, and anther one is a logic FET, which includes the FETS used in the switch circuit.

In FIG. 2A, an ion implantation process 201 is performed to dope the DRAM active area 270 and the logic area 272 with different dopant concentration. For example, a less dopant concentration (thinner dotted region) or zero dopant concentration is obtained in the DRAM active area 270, and a greater dopant concentration (thicker dotted region) is obtained in the logic active area 272. The dopants, for example, are $N_2^+$ ions.

Figure 2B:
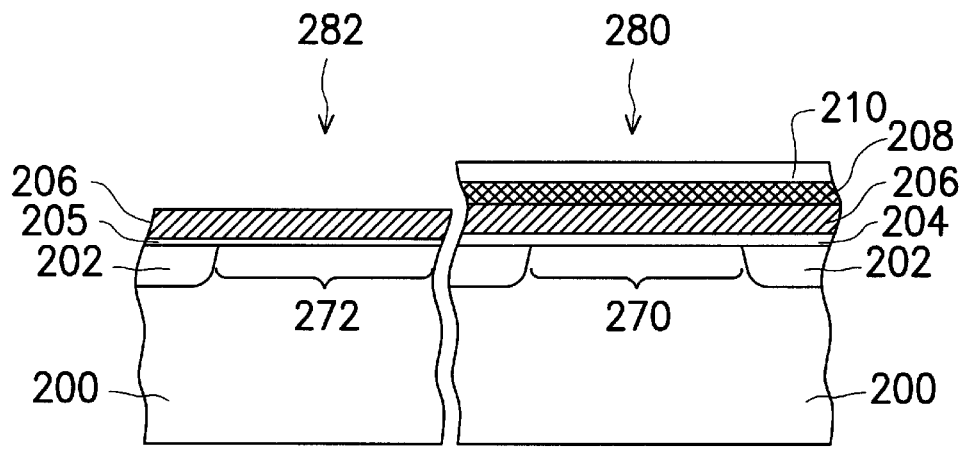

In FIG. 2B, a thermal oxidation process is performed on the substrate 200. Since the DRAM active area 270 has less dopant concentration than that of the logic active area 272, a DRAM oxide layer 204 and a logic oxide layer 205, both serving as a gate oxide layer, are formed with different thickness. The DRAM oxide layer 204 is located at the DRAM region 280, and the logic oxide layer 205 is located at the logic region 282. The DRAM oxide layer 204 is thicker than the logic oxide layer 205. A polysilicon layer 206 is formed over the substrate 200 so that the DRAM oxide layer 204 and the logic oxide layer 205 are covered by the polysilicon layer 206. The polysilicon layer 206 preferably is also doped to increased its conductivity. The doping process includes, for example, depositing dopant in situ while polysilicon is deposited. A silicide layer 208 and a cap layer 210 are sequentially formed over the DRAM oxide layer 204 at the DRAM region 280. The formation of the polysilicon layer 206 includes, for example, chemical vapor deposition (CVD). The silicide layer 208 includes, for example, tungsten silicide, titanium silicide, molybdenum silicide, tantalum silicide, or cobalt silicide, and is formed by, for example, CVD. The cap layer 210 includes, for example, silicon nitride or silicon oxide, and is formed by, for example, CVD. In order to form the silicide layer 208 and the cap layer 210 only at the DRAM region 280, the silicide layer 208 and the cap layer 210 may, for example, be first formed over the substrate 200, and be patterned to remove a portion of both layer 208, 210 at the logic region 282.

Figure 2C:
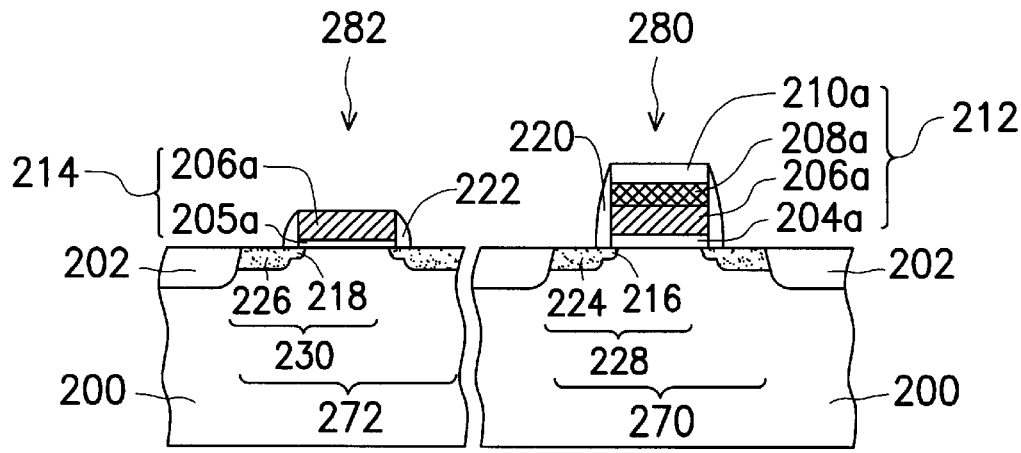

In FIG. 2C, the cap layer 210, the silicide layer 208, the polysilicon layer 206, the DRAM oxide layer 204, and the logic oxide layer 205 are patterned to formed a logic semi-gate structure 214 at the logic region 282 and a DRAM gate structure 212 at the DRAM region 280. The DRAM gate structure 212 includes a DRAM oxide layer 204a, a polysilicon layer 206a, a silicide layer 208a, and a cap layer 210a, all of which are remaining portions after patterning. The logic semi-gate structure 214 includes a logic oxide layer 205a, and a polysilicon layer 206a, both of which are remaining portions after patterning. At the current stage, the logic semi-gate structure 214 is not accomplished yet. Using the isolation structure 202, the logic semi-gate structure 214, and the DRAM gate structure 212 as a mask, a lightly doped region 216 and a lightly doped region 218 are formed by ion implantation in the substrate 200. The light doped region 216 is at each side of the DRAM gate structure 212 of the DRAM region 280. The lightly doped region 214 is at each side of the logic semi-gate structure 214 of the logic region 282. A spacer 220 is formed on each sidewall of the DRAM gate structure 212, and a spacer 222 is formed at each sidewall of the logic semi-gate structure 214. Using the isolation structure 202, the logic semi-gate structure 214, the DRAM gate structure 212, and the spacers 220, 222 as a mask, a heavily doped region 224, and a heavily doped region 226 are formed in the substrate 200 respectively overlapping the lightly doped regions 216 and 218. So, an interchangeable source/drain region 228 including the lightly doped region 216 and the heavily doped region 224 is formed at the DRAM region 280 with a lightly doped region drain (LDD) structure. Similarly, an interchangeable source/drain region 230 including the lightly doped region 218 and the heavily doped region 226 is formed at the logic region 282 with a lightly doped drain (LDD) structure. The spacers 220, 222 includes, for example, silicon nitride or silicon oxide. The formation of the spacers 220, 222 includes, for example, depositing an oxide layer over the substrate 200, performing an etching back process to remove the oxide layer so that a remaining portion of the oxide layer forms the spacers 220, 222.

Figure 2D:
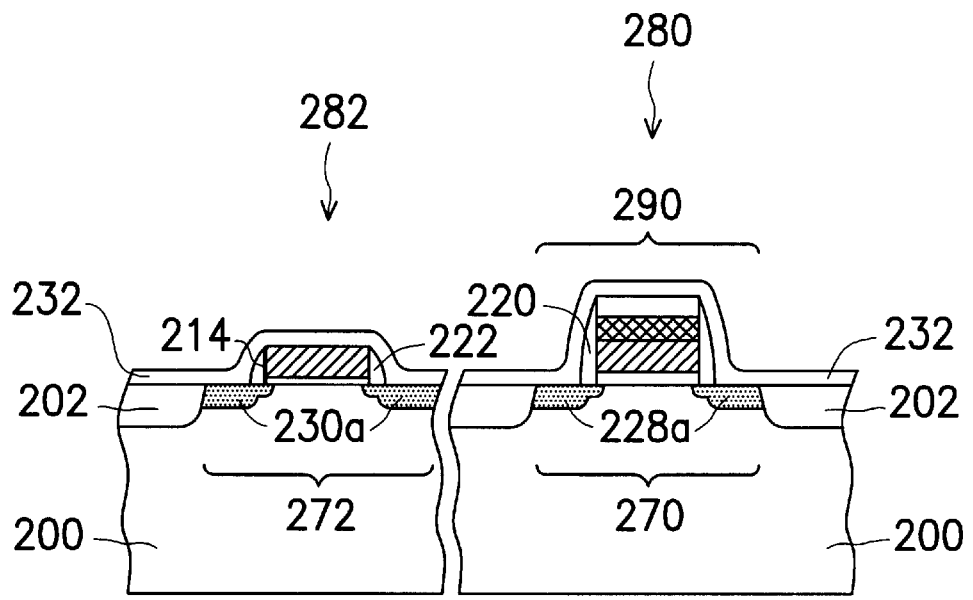

In FIG. 2C and FIG. 2D, performing an annealing process to allow implanted dopants in the interchangeable source/drain regions 228, 230 to have a more percentage of dopant activation so as to increase their performance. The interchangeable source/drain region 228 at the DRAM region 280 and the interchangeable source/drain region 230 at the logic region 282 respectively become an interchangeable source/drain regions 228a and an interchangeable source/drain regions 230a. An insulating layer 232 is formed over the substrate 200 so that the DRAM region 280 and the logic region 282 are covered by the insulating layer 232. The insulating layer 232 including, for example, silicon oxide is formed by, for example, CVD with a reaction gas of tetra-ethyl-ortho-silicate (TEOS). At this stage, at the DRAM region 280, a DRAM MOS FET 290 is formed, including the DRAM gate structure 212 shown in FIG. 2C and the interchange source/drain region 228a. At the logic region 282, a logic MOS FET is semi-formed, including the logic semi-gate structure 214 shown in FIG. 2C and the interchangeable source/drain region 230a.

Figure 2E:
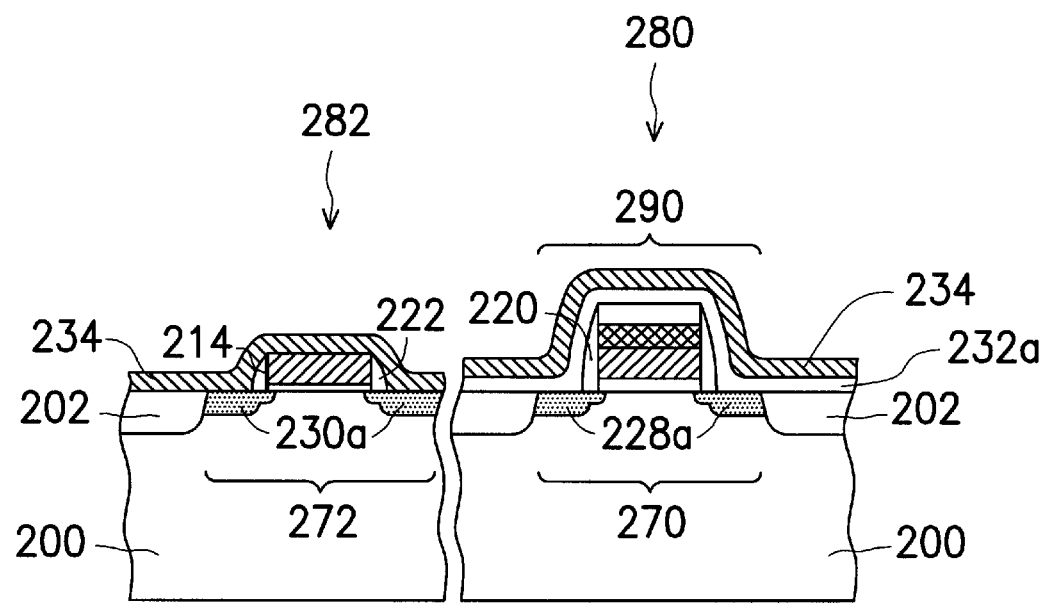

In FIG. 2E, a portion of the insulating layer 232 of FIG. 2D on the logic region 282 is removed. The insulating layer 232 becomes an insulating layer 232a. A metal layer 234 is formed over the substrate 200. The metal layer 234 includes a metallic material with a property of high temperature tolerance, such as titanium, tungsten, cobalt, tantalum, nickel, molybdenum or palladium, in which titanium is the most typical. Titanium included in the metal layer 234 is used as an example for the subsequent descriptions. The metal layer 234 is formed by, for example, direct-current (DC) sputtering deposition process, has a thickness of about 200 Å–1000 Å.

Figure 2F:
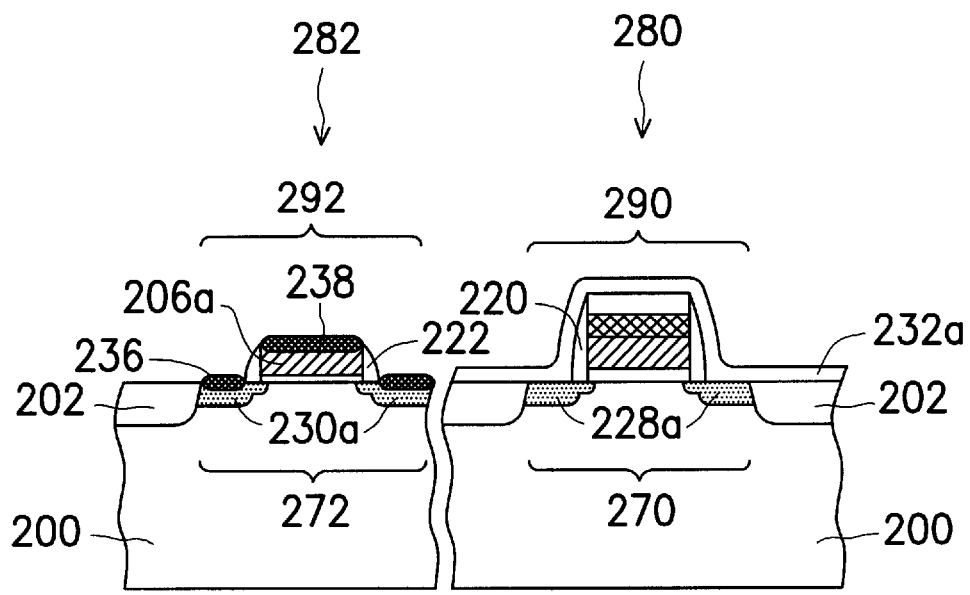

In FIG. 2F, an annealing process is performed to trigger a silicide reaction between silicon and the metallic material included in the metal layer 234, in which silicon is from both the substrate 200 and the polysilicon layer 206a. After silicide reaction, a silicide layer 236 is formed on the interchangeable source/drain region 230a, and a silicide layer 238 is formed on the logic semi-gate structure 214 shown in FIG. 2C. Since the silicide layers, 236, 238 are formed with a self-aligned property, the silicide layers, 236, 238, usually, are called self-aligned silicide (Salicide) layers, 236, 238. In order to have a better quality of the Salicide layers 236, 238, an alternative Salicide process including two stages is preferably provided. A first-stage annealing process, such as a rapid thermal annealing (RTA), is performed at a temperature of about 700° C. for a duration of about 30 seconds so as to trigger a silicide reaction between silicon and the metallic material included in the metal layer 234, in which silicon is from the substrate 200 and the polysilicon layer 206a. At this first-stage process, titanium reacts with silicon at their interface to form a C-49 titanium silicide layer, in which silicon has a C-49 crystal phase so that structure particles of the C-49 titanium silicide layer is larger, and the resistance is still not effectively reduced yet. The purpose of the formation of the C-49 titanium silicide is to have a better etching selective ratio, which allows the titanium metal to be more easily removed without s damage to the C-49 titanium silicide layer. The C-49 crystal structure is to be transformed into a C-54 structure as to be described later. Next, a portion of the metal layer 234 of FIG. 2E without reaction with silicon is removed by, for example, wet etching preferably using an acid solution mixed by, for example, hydrogen peroxide ($H_2O_2$) and ammonium hydroxide as etchant solution. The C-49 titanium silicide layer remains. The spacer 222 in the logic region 282 is exposed again. Since the DRAM region 280 is covered by the insulating layer 240 there is no reaction occurring on the DRAM MOS FET 290.

A second-stage annealing process, such as a RTA process, is performed at a temperature of about greater than 750° C. with a duration of about 10 minutes so that the C-49 crystal structure of the C-49 silicide layer is transformed into a C-54 structure, which has an orthogonal crystal structure. At the logic region 282, the C-49 titanium layer becomes the silicide layer 238 on polysilicon layer 206a, and the silicide layer 236 on the interchangeable source/drain region 230a. The whole procedures from forming the metal layer 234 in FIG. 2E to the formation of the Salicide layers 236, 238 are usually called a Salicide process even though the detail of the procedures may different. After the formation of the Salicide layers 236, 238, a logic MOS FET 292 is formed, in which the logic semi-gate structure 214 shown in FIG. 2C is fabricated to have the Salicide layer 238 on it.

In the above descriptions, the DRAM MOS FET 290 is one of several embedded MOS FETs included in a DRAM array, and is just used for descriptions. Similarly, the logic MOS FET 292 is one of several MOS FETs included in an actual logic circuit, and is just used for descriptions. In the actual logic circuit, the MOS FETs may include both NMOS FETs and PMOS FETs. The difference between NMOS FET and PMOS FET is the difference of dopant-type. The method of the invention simultaneously forming the embedded DRAM MOS FET 290 and the logic MOS FET 292 is suitable for a fabrication including PMOS FET, NMOS FET, or CMOS FET. It is well known to the one skilled in the art and is not further separately describes.

Figure 2G:
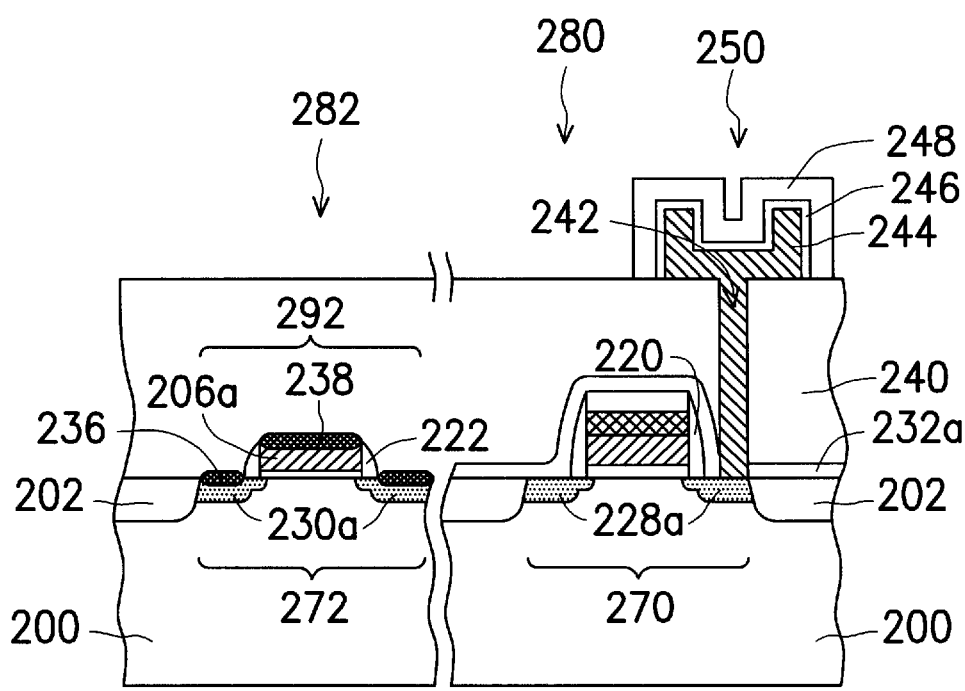

In FIG. 2G, a capacitor 250 is formed at the DRAM region 280 to have a electrical coupling with the DRAM MOS FET 290 on the interchangeable source/drain region 228a. The formation of the capacitor 250 includes continu-ously forming a dielectric layer 240 over the substrate 200. The dielectric layer 240 is preferably planarized by, for example, a chemical mechanical polishing (CMP) process. The dielectric layer 240 includes, for example, silicon oxide and is formed by CVD. A contact opening 242 is formed in the dielectric layer 240 and the insulating layer 232a by patterning them through, for example, photolithography and etching. The contact opening 242 exposes the interchangeable source/drain region 228a at one side of the DRAM gate structure 212 shown in FIG. 2C. A conductive layer 224 serving as a lower electrode of the capacitor 250 is formed on a portion of the dielectric layer abound the contact opening 242 so that the contact opening 242 is also filled by conductive layer 244. A portion of the conductive layer 244 is exposed. A conformal dielectric film layer 246 is formed over the exposed portion of the conductive layer 244. A conductive layer 248 serving as an upper electrode of the capacitor 250 is formed on the dielectric film layer 246. The conductive layers 244, 248 include, for example, doped polysilicon, and are formed by, for example, CVD. Dopants, for example, are simultaneously doped into while polysilicon is deposited. The dielectric file layer 246 include, for example, silicon oxide, silicon-nitride/silicon-oxide (NO), silicon-oxide/silicon-nitride/silicon-oxide (ONO), or a material with high dielectric constant such as $Ta_2O_5$, Pb(Zr, Ti)$O_3$ (PZT), or (Ba, Sr)Ti$_{O3}$ (BST).

Figure 3:
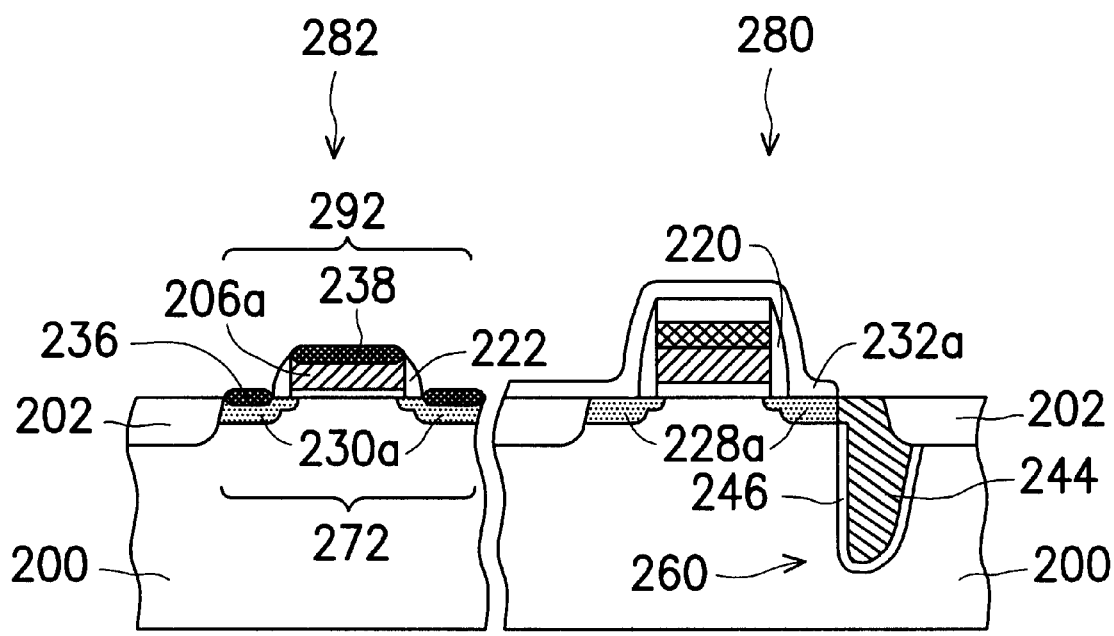
FIG. 3 is a cross-sectional view of a portion of a semiconductor substrate, schematically illustrating a structure of an embedded DRAM with a trench capacitor, according to a preferred embodiment of the invention.

The capacitor 250 shown in FIG. 2G belongs to a stack capacitor. If a trench capacitor is desired to be formed in the substrate 200, a trench capacitor 260 is shown in FIG. 3. FIG. 3 is a cross-sectional view of a portion of the semiconductor substrate, schematically illustrating a structure of an embedded DRAM with a trench-type capacitor, according to a preferred embodiment of the invention. The trench capacitor 260 includes a trench formed in the substrate 200. A dielectric film layer 246, conformal to an inner trench surface, is formed. An electrode 244 of the capacitor 260 is formed to have a coupling with the interchangeable source/drain region 228a. The substrate 200 serves another electrode of the capacitor 260. The formation of the capacitor is a conventional process, and is well known by the one skilled in the art. The details of the capacitor is not further described. The rest processes to accomplish an embedded device including a formation of, for example, multilevel interconnects is also not described.

In conclusion, the method of the invention for fabricating an embedded DRAM has several characteristics as follows:

1. The invention provides the DRAM oxide layer 204a with a greater thickness so that the DRAM oxide layer 204a and the logic oxide layer 204b can properly work with applied different operating biases. It is avoided that the logic MOS FET cannot be activated due to a too thick logic oxide layer, or a breakdown on the DRAM MOS FET occurs due to a too thin DRAM oxide layer.

2. The invention can reduce the gate resistance, and simultaneously increase the operating speed of the logic MOS FET.

3. The invention can reduce the junction sheet resistance of the interchangeable source/drain region of the logic MOS transistor by forming the Salicide on it, but the junction depth of interchangeable source/drain region of the DRAM FET remains. The charge leakage of the capacitor is effectively avoided.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating an embedded dynamic random access memory (DRAM) on a semiconductor substrate, having a DRAM region and a periphery region, the method comprising:

forming a first oxide layer and a second oxide layer on the substrate respectively at the DRAM region and the periphery region, wherein a thickness of the first oxide layer is different from a thickness of the second oxide layer;

forming a polysilicon layer over the substrate;

sequentially forming a silicide layer and a cap layer on the polysilicon layer at the DRAM region;

patterning the cap layer, the silicide layer, the polysilicon layer, and the first oxide layer to form a first gate structure at the DRAM region, and simultaneously patterning the polysilicon layer and the second oxide layer to form a second semi-gate structure at the periphery region;

implanting ions onto the substrate, using the first gate structure and the second semi-gate structure as a mask, to form a first lightly doped region in the substrate at the DRAM region and a second lightly doped region in the substrate at the periphery region;

forming a first spacer on each sidewall of the first gate structure, and a second spacer on each sidewall on each sidewall of second semi-gate structure;

implanting ions onto the substrate, using the first gate structure, the first spacer, the second semi-gate structure, and the second spacer as a mask, to form a first heavily doped region in the substrate at the DRAM region and a second heavily doped region in the substrate at the periphery region, wherein the first lightly doped region and the first heavily doped region serve as a first interchangeable source/drain region, and the second lightly doped region and the second heavily doped region serve as a second interchangeable source/drain region, forming an insulating layer over the substrate at the DRAM region;

performing a self-aligned silicide (Salicide) process to form a first Salicide layer on the second semi-gate structure and a second Salicide layer on the second interchangeable source/drain region, wherein the first Salicide layer and the second semi-gate structure form a second gate structure at the periphery region; and forming a capacitor, which is electrically coupled to the first interchangeable source/drain region at the DRAM region.

2. The method of claim 1, wherein the step of forming the first oxide layer an the second oxide layer further comprises:

performing an ion implantation process to dope the substrate at the DRAM region with a first dopant concentration, and the periphery region with a second dopant concentrations, wherein the first dopant concentration is different from the second dopant concentration; and performing a thermal oxidation process to form the first oxide layer and the second oxide layer.

3. The method of claim 2, wherein the first dopant concentration is less than the second dopant concentration so that the thickness of the first oxide layer is greater than the thickness of the second oxide layer, in which the first dopant concentration can also be zero.

4. The method of claim 2, wherein the step of performing the ion implantation process to dope the substrate comprises nitrogen ions.

5. The method of claim 1, wherein the silicide layer comprises tungsten silicide, titanium silicide, molybdenum silicide, tantalum silicide, or cobalt silicide.

6. The method of claim 1, wherein the step of forming the insulation layer comprises chemical vapor deposition (CVD).

7. The method of claim 1, wherein the step of performing the Salicide process further comprises:

forming a metal layer over the substrate;

performing a first annealing process to trigger a reaction between the metal layer and silicon material in the substrate at their interface to form the first Salicide layer and the second Salicide layer; and removing a remaining portion of the metal layer without reaction.

8. The method of claim 7, wherein the first annealing process comprises a rapid thermal annealing (RTA) process.

9. The method of claim 7, wherein the first annealing process comprises a rapid thermal annealing (RTA) process at a temperature of about 700° C. for a duration of about 30 seconds.

10. The method of claim 9, wherein after the step of removing a remaining portion of metal layer without reaction, the Salicide process further comprises performing a second annealing process so as to have a better quality of the first Salicide layer and the second Salicide.

11. The method of claim 9, wherein the second annealing process comprises a RTA process at a temperature of about greater than 750° C. for a duration of about 10 minutes.

12. The method of claim 7, wherein the step of removing the remaining portion of the metal layer without reaction comprises wet etching.

13. The method of claim 7, wherein the step of removing the remaining portion of the metal layer without reaction comprises wet etching with an acid solution mixed by hydrogen peroxide ($H_2O_2$) and ammonium hydroxide.

14. The method of claim 7, wherein the metal layer comprises titanium, tungsten, cobalt, tantalum, nickel, molybdenum or palladium.

15. The method of claim 1, wherein the silicide layer at the DRAM region comprises tungsten silicide, titanium silicide, molybdenum silicide, tantalum silicide, or cobalt silicide.

16. The method of claim 1, wherein the cap layer comprises silicon nitride or silicon oxide.

17. The method of claim 1, wherein the polysilicon layer comprises doped polysilicon.

18. The method of claim 1, wherein the step of forming the polysilicon further comprises doping dopants in situ.

19. The method of claim 1, wherein the step for forming the capacitor comprises forming a stack capacitor.

20. The method of claim 1, wherein the step for forming the capacitor comprises forming a trench capacitor.

* * * * *